(12) United States Patent
Jia et al.

(10) Patent No.: US 12,238,990 B2
(45) Date of Patent: Feb. 25, 2025

(54) DISPLAY SUBSTRATE AND METHOD FOR MANUFACTURING THE SAME, AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Li Jia, Beijing (CN); Tao Gao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 477 days.

(21) Appl. No.: 17/629,135

(22) PCT Filed: Apr. 23, 2021

(86) PCT No.: PCT/CN2021/089166
§ 371 (c)(1),
(2) Date: Jan. 21, 2022

(87) PCT Pub. No.: WO2021/227824
PCT Pub. Date: Nov. 18, 2021

(65) Prior Publication Data
US 2022/0293711 A1   Sep. 15, 2022

(30) Foreign Application Priority Data
May 15, 2020  (CN) .......................... 202010414800.3

(51) Int. Cl.
| H10K 59/131 | (2023.01) |
| H10K 59/12 | (2023.01) |
| H10K 59/122 | (2023.01) |
| H10K 59/123 | (2023.01) |
| H10K 77/10 | (2023.01) |
| H10K 102/00 | (2023.01) |

(52) U.S. Cl.
CPC ......... *H10K 59/131* (2023.02); *H10K 59/122* (2023.02); *H10K 59/123* (2023.02);
(Continued)

(58) Field of Classification Search
CPC .. H10K 59/131; H10K 59/1315; H10K 59/82; H10K 59/873; H10K 59/8731;
(Continued)

(56) References Cited

U.S. PATENT DOCUMENTS 11,127,809 B2 * 9/2021 Wang .................... H10K 50/844
11,522,144 B2 * 12/2022 Li ........................ H10K 59/873
(Continued)

FOREIGN PATENT DOCUMENTS

| CN | 109671761 A | 4/2019 |
| CN | 110265583 A | 9/2019 |
(Continued)

*Primary Examiner* — Jesse Y Miyoshi
(74) *Attorney, Agent, or Firm* — HOUTTEMAN LAW LLC

(57) ABSTRACT

A display substrate and a manufacturing method therefor, and a display device are provided. The display substrate includes: a base substrate; a planarization layer on the base substrate; an isolation structure and connection pads on the base substrate; and first protective parts on a side of the connection pads away from the base substrate, where the isolation structure includes a first groove formed in the planarization layer, and a first isolation sub-layer and a second isolation sub-layer on a side of the planarization layer away from the base substrate, a first space is provided between the first isolation sub-layer and the second isolation sub-layer, and an orthographic projection of the first space on the base substrate is within an orthographic projection of the first groove on the base substrate; and the first protective parts, the first isolation sub-layer and the second isolation sub-layer are disposed in a same layer.

20 Claims, 5 Drawing Sheets

(52) U.S. Cl.
CPC ........ *H10K 77/111* (2023.02); *H10K 59/1201* (2023.02); *H10K 2102/311* (2023.02)

(58) Field of Classification Search
CPC ............. H10K 59/8722; H10K 59/871; H10K 59/122; H10K 50/88; H10K 50/84; H10K 50/844; H10K 50/8445; H10K 50/8426; H10K 50/841; H10K 77/111; H10K 2102/311
See application file for complete search history.

(56) References Cited

U.S. PATENT DOCUMENTS

| | | | |
|---|---|---|---|
| 11,545,535 B2 * | 1/2023 | Ban | H10K 59/131 |
| 2016/0190216 A1 * | 6/2016 | Yang | H10K 59/131 |
| | | | 257/40 |
| 2016/0190389 A1 * | 6/2016 | Lee | G02F 1/136277 |
| | | | 438/28 |
| 2016/0268352 A1 * | 9/2016 | Hong | H10K 59/88 |
| 2016/0320878 A1 * | 11/2016 | Hong | G06F 1/1652 |
| 2018/0052493 A1 * | 2/2018 | Hong | B32B 3/08 |
| 2018/0175131 A1 * | 6/2018 | Lee | H10K 59/131 |
| 2019/0148653 A1 | 5/2019 | Chen et al. | |
| 2021/0028249 A1 | 1/2021 | Ding et al. | |

FOREIGN PATENT DOCUMENTS

| | | |
|---|---|---|
| CN | 110676302 A | 1/2020 |
| CN | 110911421 A | 3/2020 |
| CN | 111554722 A | 8/2020 |

* cited by examiner

DISPLAY SUBSTRATE AND METHOD FOR MANUFACTURING THE SAME, AND DISPLAY DEVICE

CROSS-REFERENCE TO RELATED APPLICATIONS

The present disclosure claims the priority to Chinese Patent Application No. 202010414800.3 filed on May 15, 2020, the contents of which are incorporated herein by reference in their entirety.

TECHNICAL FIELD

The present disclosure relates to the field of display technology, and particularly relates to a display substrate and a method for manufacturing a display substrate, and a display device.

BACKGROUND

With the development of technologies, full-screen display has gradually become popular in recent years. An Organic Light Emitting Device (OLED) display has the characteristics of self-luminescence, high brightness, high contrast and low operating voltage and is applicable to manufacture of a flexible display, and thus has become a mainstream product in the display field.

SUMMARY

An embodiment of the present disclosure provides a display substrate, including:
a base substrate including a display region and a bonding region located on a side of the display region, with the display region including a main display region and a stress relief region, and the stress relief region including a plurality of via regions, and a bridge region among the via regions;
a planarization layer disposed on the base substrate and located in the display region and the bridge region;
an isolation structure and connection pads disposed on the base substrate, with the isolation structure located in the bridge region and surrounding the via regions, and the connection pads located in the bonding region; and
first protective parts which are disposed on a side of the connection pads away from the base substrate and cover the connection pads,
where the isolation structure includes a first groove formed in the planarization layer, and a first isolation sub-layer and a second isolation sub-layer disposed on a side of the planarization layer away from the base substrate, a first space is provided between the first isolation sub-layer and the second isolation sub-layer, and an orthographic projection of the first space on the base substrate is located within an orthographic projection of the first groove on the base substrate, and
the first protective parts, the first isolation sub-layer and the second isolation sub-layer are disposed in a same layer and are made of a same material.

In some implementations, the display substrate further includes:
a driving circuit layer which is disposed on a side of the planarization layer close to the base substrate and includes a thin film transistor located in the display region;
a passivation layer which is disposed on a side of the driving circuit layer away from the base substrate and is located in the main display region; and
an organic light emitting device which is disposed on a side of the planarization layer away from the base substrate and is located in the display region,
where a first electrode of the organic light emitting device is connected to a drain of the thin film transistor through a via penetrating through the passivation layer and the planarization layer.

In some implementations, the display substrate further includes:
second protective parts disposed on a side of the connection pads close to the base substrate, with an orthographic projection of each of the connection pads on the base substrate located within an orthographic projection of each of the second protective parts on the base substrate.

In some implementations, the second protective parts and the passivation layer are disposed in a same layer and are made of a same material.

In some implementations, the planarization layer includes a first planarization film layer and a second planarization film layer sequentially disposed on the base substrate, and a transfer electrode is disposed between the first planarization film layer and the second planarization film layer, and
the drain of the thin film transistor is connected to the transfer electrode through a via penetrating through the passivation layer and the first planarization film layer, and the first electrode of the organic light emitting device is connected to the transfer electrode through a via penetrating through the second planarization film layer.

In some implementations, the first groove is disposed in the second planarizing film layer.

In some implementations, the connection pads and the transfer electrode are disposed in a same layer and are made of a same material.

In some implementations, the first electrode of the organic light emitting device is disposed on a side of the planarization layer away from the base substrate, a pixel defining layer is disposed on a side of the first electrode of the organic light emitting device away from the base substrate, and a support part is disposed on a side of the pixel defining layer away from the base substrate.

In some implementations, the driving circuit layer further includes an interlayer insulating layer provided therein with a second groove located in the bonding region, an organic insulating layer is filled in the second groove, and the passivation layer is located on a side of the organic insulating layer away from the base substrate.

In some implementations, a shape of a via in the via region includes a shape of a Chinese character "口".

An embodiment of the present disclosure further provides a display device, which includes the display substrate described above.

An embodiment of the present disclosure further provides a method for manufacturing a display substrate, including:
forming a base substrate including a display region and a bonding region located on a side of the display region, with the display region including a main display region and a stress relief region, and the stress relief region including a plurality of via regions, and a bridge region among the via regions;
forming a planarization layer in the display region and the bridge region on the base substrate;
forming an isolation structure surrounding the via regions in the bridge region on the base substrate;
forming connection pads in the bonding region on the base substrate; and forming first protective parts covering the connection pads on a side of the connection pads away from the base substrate, where the isolation structure includes a first groove formed in the planarization layer, and a first isolation sub-layer and a second isolation sub-layer disposed on a side of the planarization layer away from the base substrate, a first space is provided between the first isolation sub-layer and the second isolation sub-layer, and an orthographic projection of the first space on the base substrate is located within an orthographic projection of the first groove on the base substrate, and the first protective parts, the first isolation sub-layer and the second isolation sub-layer are disposed in a same layer and are made of a same material.

In some implementations, the method further includes: before forming the planarization layer, forming a driving circuit layer including a thin film transistor in the display region on the base substrate;

forming a passivation layer on a side of the driving circuit layer away from the base substrate, with the passivation layer located in the main display region; and forming an organic light emitting device on a side of the planarization layer away from the base substrate, with the organic light emitting device located in the display region, where a first electrode of the organic light emitting device is connected to a drain of the thin film transistor through a via penetrating through the passivation layer and the planarization layer.

In some implementations, the method further includes: forming second protective parts on a side of the connection pads close to the base substrate, with an orthographic projection of each of the connection pads on the base substrate located within an orthographic projection of each of the second protective parts on the base substrate.

In some implementations, the forming the second protective parts includes: forming the second protective parts and the passivation layer in a same layer by a same material.

In some implementations, the forming the planarization layer includes:

sequentially forming a first planarization film layer, a transfer electrode and a second planarization film layer in a direction away from the base substrate, where the drain of the thin film transistor is connected to the transfer electrode through a via penetrating through the passivation layer and the first planarization film layer, and the first electrode of the organic light emitting device is connected to the transfer electrode through a via penetrating through the second planarization film layer.

In some implementations, the forming the isolation structure includes:

forming the first groove in the second planarization film layer.

In some implementations, the forming the connection pads includes:

forming the connecting pads and the transfer electrode in a same layer by a same material.

In some implementations, the forming the organic light emitting device includes:

forming the first electrode of the organic light emitting device on a side of the planarization layer away from the base substrate, the method further includes:

forming a pixel defining layer on a side of the first electrode of the organic light emitting device away from the base substrate; and forming a support part on a side of the pixel definition layer away from the base substrate.

In some implementations, the forming the driving circuit layer includes: forming an interlayer insulating layer, where the interlayer insulating layer is provided therein with a second groove located in the bonding region, an organic insulating layer is filled in the second groove, and the passivation layer is located on a side of the organic insulating layer away from the base substrate.

DETAIL DESCRIPTION OF EMBODIMENTS

In order to enable those of ordinary skill in the art to better understand the technical solutions of the present disclosure, the present disclosure is further described in detail below with reference to the drawings and specific implementations.

Unless otherwise defined, technical terms or scientific terms used herein should have general meanings that are understood by those of ordinary skill in the technical field of the present disclosure. The words "first", "second" and the like used herein do not denote any order, quantity or importance, but are just used to distinguish between different elements. Similarly, the words "one", "a", "the" and the like do not denote a limitation to quantity, and indicate the existence of "at least one" instead. The words "include", "comprise" and the like indicate that an element or object before the words covers the elements or objects or the equivalents thereof listed after the words, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

Figure 1:
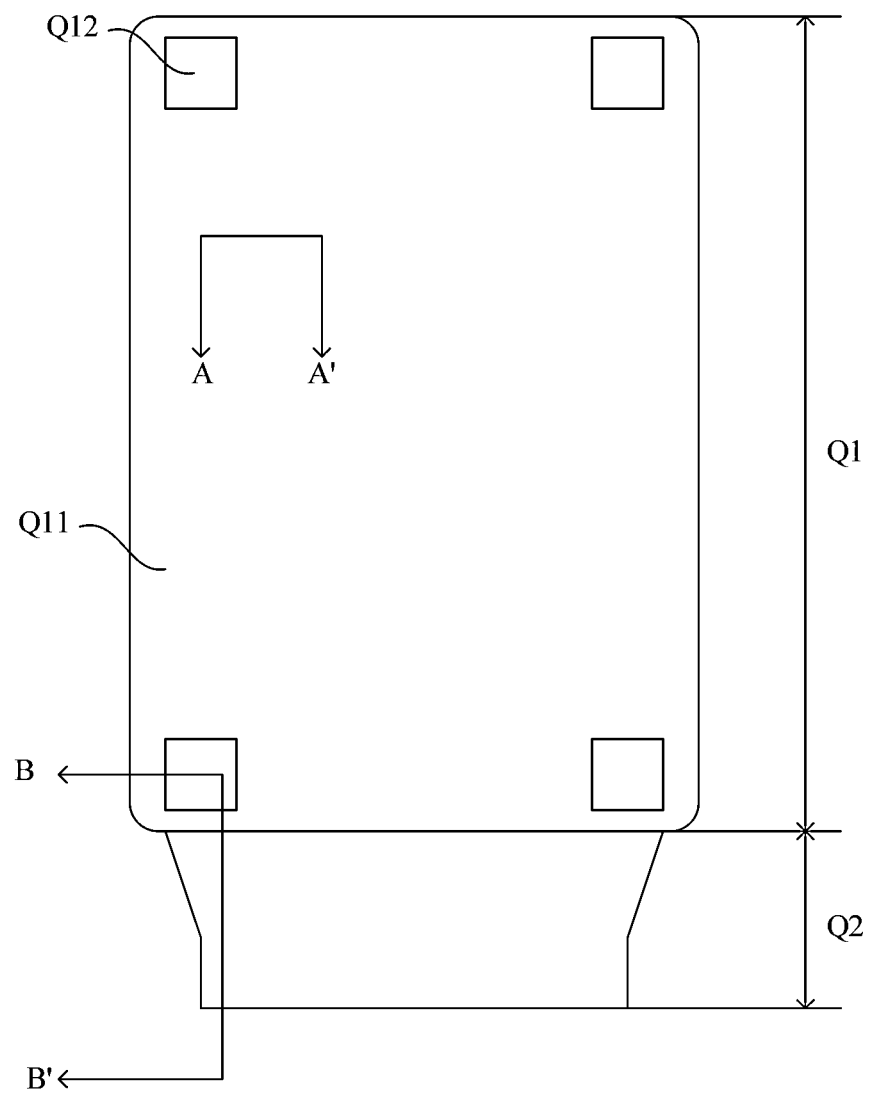
FIG. 1 is a schematic structural diagram of a display substrate according to an embodiment of the present disclosure.
Figure 2:
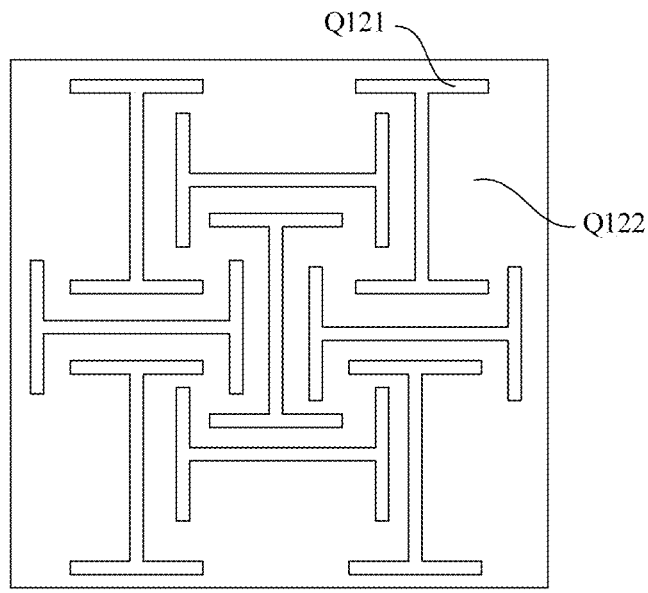
FIG. 2 is a schematic structural diagram of a stress relief region of a display substrate according to an embodiment of the present disclosure.

FIG. 1 is a schematic structural diagram of a display substrate according to an embodiment of the present disclosure, the display substrate is applied to a full-screen display panel, and four sides of the display substrate are bent toward a side away from a display surface. As shown in FIG. 1, the display substrate includes a base substrate including a display region Q1 and a bonding region Q2 on a side of the display region Q1; the display region Q1 includes a main display region Q11 and a stress relief region Q12; and the stress relief region Q12 is provided for relieving a stress generated when the four sides of the display substrate are bent, so as to prevent the display substrate from breaking when being bent. The stress relief region Q12 may be arranged at any of four corners of the display region Q1, or may be arranged at any position of the display region Q1 at which the display substrate is to be bent. In the embodiment of the present disclosure, description will be given by taking a case where each of the four corners of the display region Q1 is provided with one stress relief region Q12 as an example. Since the display substrate is to be applied to a full-screen display panel, pixel structures are also to be formed in the stress relief region Q12. Thus, as shown in FIG. 2, the stress relief region Q12 not only includes via regions Q121 for forming vias configured to relieve the stress, but also includes a bridge region Q122 for forming the pixel structures and signal lines for supplying signals to the pixel structures.

The pixel structures are disposed in the main display region Q11 and the bridge region Q122 of the display region Q1; vias are disposed in the via regions Q121; and connection pads 120 (see FIG. 5 and FIG. 6) are disposed in the bonding region Q2, and fan-out wires may further be disposed in the bonding region Q2, with one end of each of the fan-out wires connected to the connection pad, and another end of each of the fan-out wires connected to the pixel structure in the display region Q1 (generally, the fan-out wire is connected to the pixel structure through a data line).

Figure 3:
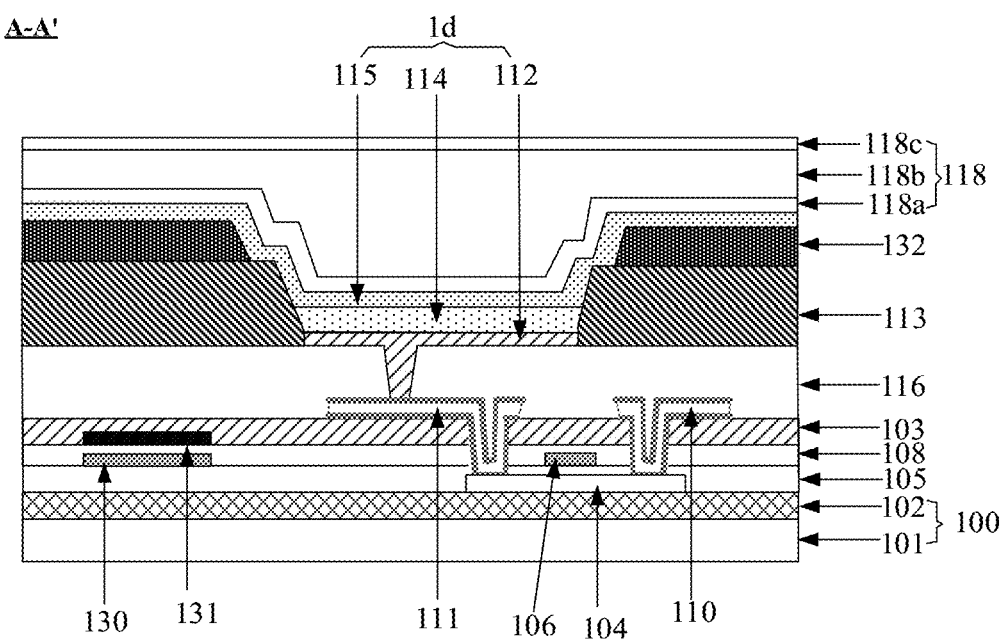
FIG. 3 is a sectional view of the display substrate shown in FIG. 1 taken along a line A-A'.

FIG. 3 is a sectional view of the display substrate of FIG. 1 taken along a line A-A'. As shown in FIG. 3, the display substrate may include a base substrate 100, a driving circuit layer, and an organic light emitting device 1d (the driving circuit layer and the organic light emitting device 1d constitute the pixel structure); the base substrate 100 may be a flexible substrate to improve flexibility of the display substrate, so that the display substrate can be endowed with properties such as bendability and foldability, so as to expand an application range of the display substrate; but the base substrate 100 is not limited thereto, the base substrate 100 may also be a rigid substrate, and specifically, the properties of the base substrate 100 may be determined according to actual requirements of a product.

In addition, the base substrate 100 may have a single-layer structure or a multi-layer structure. For example, the base substrate 100 may include a polyimide layer 101 and a buffer layer 102, which are sequentially stacked. In some implementations, the base substrate 100 may include a plurality of sets of the polyimide layer and the buffer layer 102, which are sequentially stacked; the buffer layer 102 may be made of silicon nitride, silicon oxide or the like, so as to achieve effects of blocking water, oxygen and alkaline ions; and it should be noted that the structure of the base substrate 100 is not limited thereto, and may be determined according to actual requirements.

It should be noted that, in order to facilitate subsequent manufacturing of required components in various regions of the display substrate, the regions may be defined on the base substrate 100 in advance, for example, the base substrate 100 may be divided into the display region Q1 and the bonding region Q2 first, then the display region Q1 may be divided into the main display region Q11 and the stress relief region Q12, and the stress relief region Q12 may be divided into the via regions Q121 and the bridge region Q122.

The driving circuit layer may be formed on the base substrate 100, and a part of the driving circuit layer located in the display region Q1 may include a thin film transistor and a capacitor structure.

As shown in FIG. 3, the thin film transistor may be a top-gate thin film transistor, which may include an active layer 104, a first gate insulating layer 105, a gate 106, a second gate insulating layer 108, an interlayer dielectric layer 103, a source 110, and a drain 111. Specifically, the active layer 104 may be formed on the buffer layer 102, the first gate insulating layer 105 covers the buffer layer 102 and the active layer 104, the gate 106 is formed on a side of the first gate insulating layer 105 away from the active layer 104, the second gate insulating layer 108 covers the gate 106 and the first gate insulating layer 105, the interlayer dielectric layer 103 covers the second gate insulating layer 108, the source 110 and the drain 111 are formed on a side of the interlayer dielectric layer 103 away from the base substrate 100 and are respectively located at two opposite ends of the gate 106, and the source 110 and the drain 111 may be in contact with two opposite ends of the active layer 104 respectively through vias penetrating through the first gate insulating layer 105, the second gate insulating layer 108, and the interlayer dielectric layer 103. It should be understood that the thin film transistor may also be a bottom-gate thin film transistor.

As shown in FIG. 3, the capacitor structure may include a first electrode plate 130 and a second electrode plate 131, the first electrode plate 130 and the gate 106 are disposed in a same layer, and the second electrode plate 131 is disposed between the second gate insulating layer 108 and the interlayer dielectric layer 103 and is arranged opposite to the first electrode plate 130.

For example, materials of the gate 106, the first electrode plate 130 and the second electrode plate 131 may include a metal material or an alloy material, such as molybdenum, aluminum and titanium. The source 110 and the drain 111 each may include a metal material or an alloy material, for example, each may have a single-layer structure or a multi-layer structure made of a metal such as molybdenum, aluminum, and titanium, and the multi-layer structure may be a laminated layer of multiple metal layers, such as a laminated layer of titanium/aluminum/titanium (Al/Ti/Al).

As shown in FIG. 3, the organic light emitting device 1d is located in the display region Q1, and may include a first electrode 112 formed on the interlayer dielectric layer 103. It should be understood that the organic light emitting device 1d may further include a light emitting layer 114 and a second electrode 115. A pixel defining part 113 may be formed over the interlayer dielectric layer 103.

When the thin film transistor in the display region Q1 is a top-gate thin film transistor, a planarization layer 116 may be formed before forming the organic light emitting device 1d, and the planarization layer 116 may have a single-layer structure or a multi-layer structure; the planarization layer 116 is generally made of an organic material, such as photoresist, acrylic-based polymer and silicon-based polymer; as shown in FIG. 3, the planarization layer 116 is formed between the interlayer dielectric layer 103 and the first electrode 112. The first electrode 112 may be electrically connected to the drain 111 through a via penetrating through the planarization layer 116, and the first electrode 112 may be an anode made of Indium Tin Oxide (ITO), Indium Zinc Oxide (IZO), Zinc Oxide (ZnO) or the like; the pixel defining part 113 may cover the planarization layer 116, and may be made of an organic material such as photoresist, and a part of the pixel defining part 113 located in the display region Q1 may be provided with a pixel opening which exposes the first electrode 112; the light emitting layer 114 is located in the pixel opening and formed on the first electrode 112 (i.e., on a side of the first electrode 112 away from the base substrate 100), the light emitting layer 114 may be made of a small molecular organic material or a polymer molecular organic material, which may be a fluorescent material or a phosphorescent material, and may emit red light, green light, blue light, white light or the like; moreover, according to actual requirements, the light emitting layer 114 may further include functional layers such as an electron injection layer, an electron transport layer, a hole injection layer, and a hole transport layer; the second electrode 115 covers the light emitting layer 114, and has a polarity opposite to that of the first electrode 112; and the second electrode 115 may be a cathode made of a metal material such as lithium (Li), aluminum (Al), magnesium (Mg) and silver (Ag).

It should be noted that, as shown in FIG. 3, the organic light emitting device 1d including the first electrode 112, the light emitting layer 114 and the second electrode 115 may constitute one light-emitting sub-pixel. A plurality of light-emitting sub-pixels may be arranged in an array in the display region Q1. In addition, it should be noted that first electrodes 112 of the light-emitting sub-pixels are independent from one another, while second electrodes 115 of the light-emitting sub-pixels may be connected as a single piece; that is, the second electrodes 115 may be formed into a single piece structure which covers an entire surface of the base substrate 100 and functions as a common electrode of multiple organic light emitting devices 1d.

In some implementations, as shown in FIG. 3, a support part 132 may be further disposed on a side of the pixel defining part 113 away from the interlayer dielectric layer 103, and the support part 132 can support a protective film (not shown) to prevent the protective film from coming into contact with the first electrode 112 or other wires, so as to avoid the first electrode 112 or the other wires being easily damaged. It should be noted that the protective film is mainly used during a process of transferring a semi-finished product to prevent the semi-finished product from being damaged in the process of transferring. Specifically, the protective film may be formed to cover the base substrate formed with the support part 132 thereon in a process of transferring the base substrate to a deposition line, and may be removed when deposition of luminescent material is to be performed.

For example, a material of the support part 132 may be the same as that of the pixel defining part 113, and the support part 132 and the pixel defining part 113 may be formed by a single patterning process, but these are not limited, the material of the support part 132 may be different from that of the pixel defining part 113, and the support part 132 and the pixel defining part 113 may be formed by different patterning processes.

Figure 4:
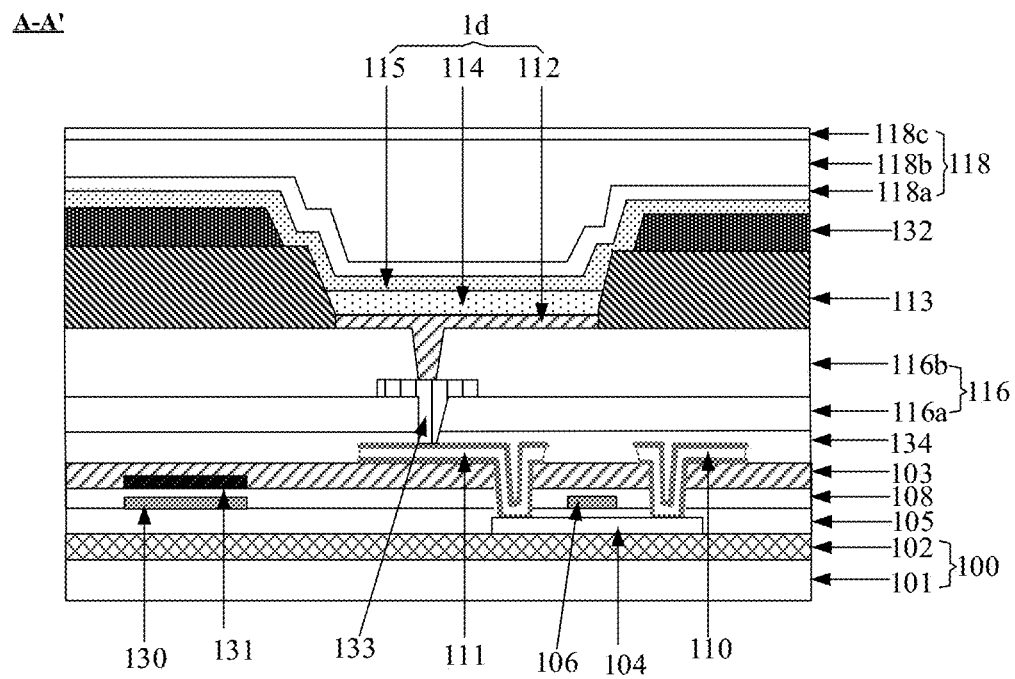
FIG. 4 is another sectional view of the display substrate shown in FIG. 1 taken along the line A-A'.

In some implementations, as shown in FIG. 4, the first electrode 112 may be electrically connected to the drain 111 through a transfer electrode 133. When the first electrode 112 is electrically connected to the drain 111 through the transfer electrode 133, the planarization layer 116 may have a double-layer structure, and may specifically include a first planarization film (PLN1) layer 116a and a second planarization film (PLN2) layer 116b which are formed in sequence, and a passivation (PVX) layer 134 may be further formed between the first planarization film layer 116a and the interlayer dielectric layer 103, and may be made of silicon oxide, silicon nitride, silicon oxynitride or the like; the passivation layer 134 covers the source 110 and the drain 111; the transfer electrode 133 is formed between the first planarization film layer 116a and the second planarization film layer 116b, and is electrically connected to the drain 111 through a via sequentially penetrating through the first planarization film layer 116a and the passivation layer 134; and the first electrode 112 may be electrically connected to the transfer electrode 133 through a via penetrating through the second planarization film layer 116b.

The display substrate may further include a packaging layer 118, which may include a first inorganic packaging film layer 118a, an organic packaging film layer 118b, and a second inorganic packaging film layer 118c, which are sequentially stacked. The first inorganic packaging film layer 118a and the second inorganic packaging film layer 118c are configured to prevent water and oxygen from entering the display region Q1 from a side of the display substrate facing the display surface and the via regions Q121; and the first inorganic packaging film layer 118a and the second inorganic packaging film layer 118c may be made of an inorganic material such as silicon nitride and silicon oxide. The organic packaging film layer 118b is used for planarization, so as to facilitate manufacturing of the second inorganic packaging film layer 118c, and the organic packaging film layer 118b may be made of an acrylic-based polymer, a silicon-based polymer or the like.

Figure 5:
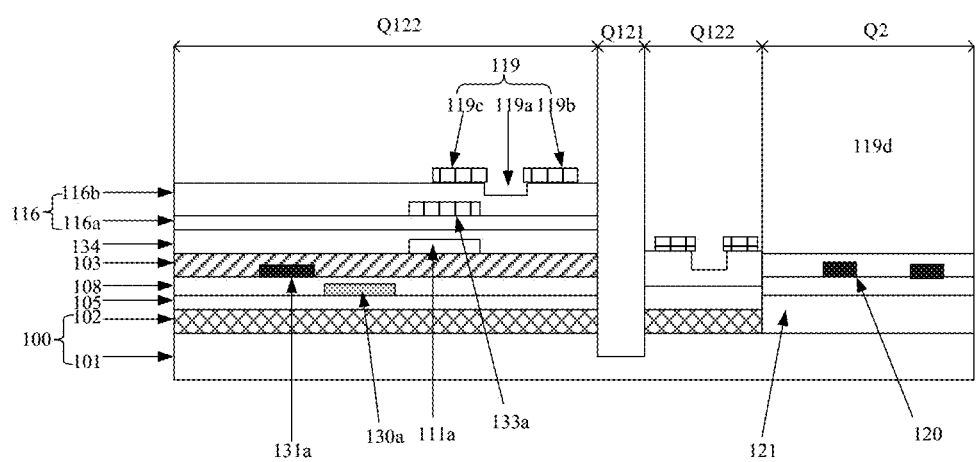
FIG. 5 is a sectional view of the display substrate shown in FIG. 1 taken along a line B-B'.

As shown in FIG. 5, in the via regions Q121 of the stress relief region Q12, a part of material of each of the buffer layer 102, the first gate insulating layer 105, the second gate insulating layer 108, the interlayer dielectric layer 103, the planarization layer 116 (the first planarization film layer 116a and the second planarization film layer 116b), and the base substrate 100 is etched to form vias in the via regions Q121. A shape of each of the vias includes, but is not limited to, a shape of a Chinese character "⊥". In the bridge region Q122, an isolation structure 119 surrounding the vias is formed (see FIG. 5 and FIG. 6) and includes a first groove 119a formed in the planarization layer 116 (in the second planarization film layer 116b), and a first isolation sub-layer 119b and a second isolation sub-layer 119c disposed on a side of the planarization layer 116 away from the base substrate 100, a first space is provided between the first isolation sub-layer 119b and the second isolation sub-layer 119c, and an orthographic projection of the first space on the base substrate 100 is located within an orthographic projection of the first groove 119a on the base substrate 100. The isolation structure 119 is configured to break off the light emitting layer 114 of the organic light emitting device 1d at the isolation structure 119 when the light emitting layer 114 is formed, so as to prevent water and oxygen at the vias from corroding the organic light emitting device 1d, thereby avoiding affecting a performance of the organic light emitting device 1d. Similarly, as shown in FIG. 5, when the gate 106, the source 110, the drain 111, the transfer electrode 133 and the like are formed, signal lines may formed in the bridge region Q122 (to introduce signals into the pixel structures in the bridge region Q122); the signal lines in the bridge region Q122 may be formed by electrical connections 130a, 131a, 111a and 133a shown in FIG. 5; the electrical connection 130a and the gate 106 are disposed in a same layer and are made of a same material, the electrical connection 131a and the second electrode plate 131 of the capacitor structure are disposed in a same layer and are made of a same material; the electrical connection 111a, the source 110 and the drain 111 are disposed in a same layer and are made of a same material, and the electrical connection 133a and the transfer electrode 133 are disposed in a same layer and are made of a same material. The connection pads 120 are formed in the bonding region Q2 (see FIG. 5 and FIG. 6).

It is found that, as shown in FIG. 5, since the bonding region Q2 is to be folded to a back side (i.e., a side opposite to the display surface) of the display substrate, the buffer layer 102, the first gate insulating layer 105, the second gate insulating layer 108, and the interlayer dielectric layer 103 in the bonding region Q2 are removed, that is, a second groove is formed in the bonding region Q2, an organic insulating layer 121 is filled in the second groove, and the connection pads 120 are formed on the organic insulating layer 121. In such case, water and oxygen entering through the via region Q121 may corrode the connection pads 120.

Figure 6:
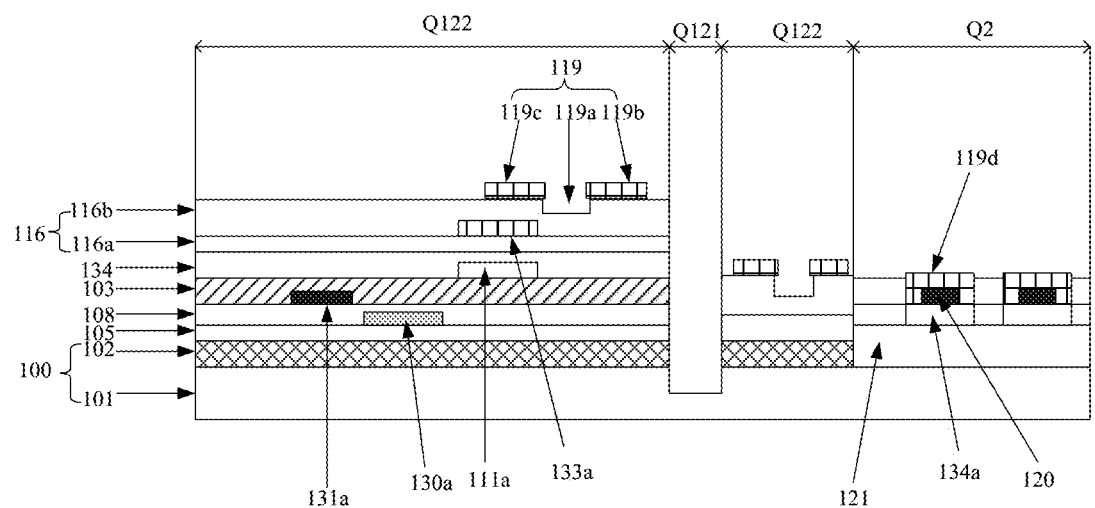
FIG. 6 is another sectional view of the display substrate shown in FIG. 1 taken along the line B-B'.

In order to solve the above technical problem, as shown in FIG. 6, in the display substrate provided by the embodiment of the present disclosure, first protective parts 119d may be disposed on a side of the connection pads 120 away from the base substrate 100 to cover the connection pads 120, and the first protective parts 119d, the first isolation sub-layer 119b and the second isolation sub-layer 119c are disposed in a same layer and are made of a same material, that is, the first protective parts 119d, the first isolation sub-layer 119b and the second isolation sub-layer 119c are formed simultaneously. Thus, the connection pads 120 can be prevented from being corroded by water and oxygen, without increasing process steps and process cost.

In some implementations, the first protective parts 119d, the first isolation sub-layer 119b and the second isolation sub-layer 119c may be made of a material the same as that of the passivation layer, and each may be made of silicon oxide, silicon nitride, silicon oxynitride or the like.

In the embodiments of the present disclosure, the first protective parts 119d are disposed in correspondence with the connection pads 120 one to one, that is, the first protective parts 119d are disposed apart from one another, which facilitates folding the bonding region Q2 to the side of the display substrate away from the display surface. The first protective parts 119d of the connection pads 120 may also be formed into a single piece, but the structure of the first protective parts 119d is not limited in the embodiment of the present disclosure, as long as it is ensured that the first protective parts 119d can cover the connection pads 120.

In some implementations, second protective parts 134a may be disposed in the bonding region Q2 on a side of the connection pads 120 close to the base substrate 100. That is, as shown in FIG. 6, the connection pads 120 are formed on the second protective parts 134a. Moreover, an orthographic projection of each of the connection pads 120 on the base substrate 100 is located within an orthographic projection of each of the second protective parts 134a on the base substrate 100. Thus, each of the connection pads 120 is wrapped by the first protective part 119d and the second protective part 134a, which may effectively avoid contact of moisture with the connection pads 120 to prevent an aluminum material of the connection pads 120 from being corroded by the moisture, thereby avoiding an impedance and an electrical performance of the connection pads 120 being affected.

In the embodiment of the present disclosure, the second protective parts 134a are disposed in correspondence with the connection pads 120 one to one. In this way, when the first protective parts 119d are also disposed in correspondence with the connection pads 120 one to one, the first protective part 119d and the second protective part 134a corresponding to a same one of the connection pads 120 form a structure having a shape of a Chinese character "口", and confine the connection pad 120 therein, so as to better protect the connection pad 120. The second protective parts 134a of the connection pads 120 may also be formed into a single piece, but the structure of the second protective parts 134a is not limited in the embodiment of the present disclosure.

In some implementations, the second protective parts 134a and the passivation layer are disposed in a same layer and are made of a same material, that is, the second protective parts 134a and the passivation layer are formed by a single patterning process, so that the number of the process steps is not increased.

An embodiment of the present disclosure further provides a display device, which includes the display substrate described above. The display device may be an electronic device having a display panel, such as a mobile phone, a tablet computer, an electronic watch, a sports bracelet and a notebook computer. Reference may be made to the above description of the technical effects of the display substrate for the technical effects of the display device, which are not repeated here.

Figure 7:
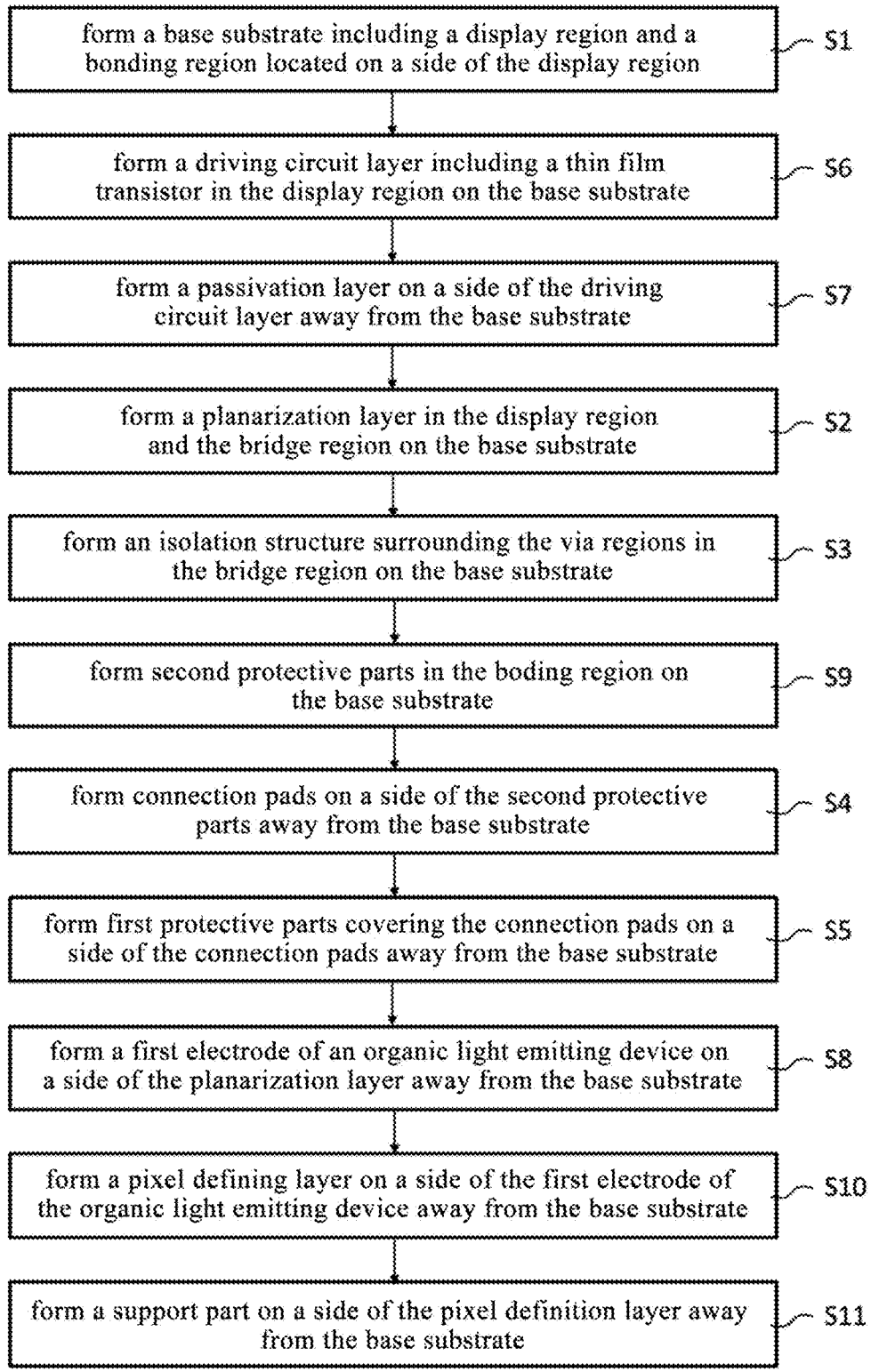
FIG. 7 is a flowchart illustrating a method for manufacturing a display substrate according to an embodiment of the present disclosure.

An embodiment of the present disclosure further provides a method for manufacturing a display substrate. FIG. 7 is a flowchart illustrating a method for manufacturing a display substrate according to an embodiment of the present disclosure.

As shown in FIG. 7, the method for manufacturing the display substrate according to the embodiment of the present disclosure includes:

S1, forming a base substrate including a display region and a bonding region located on a side of the display region, with the display region including a main display region and a stress relief region, and the stress relief region including a plurality of via regions, and a bridge region among the via regions;

S2, forming a planarization layer in the display region and the bridge region on the base substrate;

S3, forming an isolation structure surrounding the via regions in the bridge region on the base substrate;

S4, forming connection pads in the bonding region on the base substrate; and

S5, forming first protective parts covering the connection pads on a side of the connection pads away from the base substrate, where the isolation structure includes a first groove formed in the planarization layer, and a first isolation sub-layer and a second isolation sub-layer disposed on a side of the planarization layer away from the base substrate, a first space is provided between the first isolation sub-layer and the second isolation sub-layer, and an orthographic projection of the first space on the base substrate is located within an orthographic projection of the first groove on the base substrate, and the first protective parts, the first isolation sub-layer and the second isolation sub-layer are disposed in a same layer and are made of a same material.

In some implementations, as shown in FIG. 7, the method further includes:

S6, forming a driving circuit layer including a thin film transistor in the display region on the base substrate before S2;

S7, forming a passivation layer on a side of the driving circuit layer away from the base substrate, with the passivation layer located in the main display region; and S8, forming an organic light emitting device on a side of the planarization layer away from the base substrate, with the organic light emitting device located in the display region, where a first electrode of the organic light emitting device is connected to a drain of the thin film transistor through a via penetrating through the passivation layer and the planarization layer.

In some implementations, as shown in FIG. 7, the method further includes:

S9, forming second protective parts on a side of the connection pads close to the base substrate, with an orthographic projection of each of the connection pads on the base substrate located within an orthographic projection of each of the second protective parts on the base substrate.

In some implementations, the S9 includes:
forming the second protective parts and the passivation layer in a same layer by a same material.

In some implementations, the S2 includes:
sequentially forming a first planarization film layer, a transfer electrode and a second planarization film layer in a direction away from the base substrate,
where the drain of the thin film transistor is connected to the transfer electrode through a via penetrating through the passivation layer and the first planarization film layer, and the first electrode of the organic light emitting device is connected to the transfer electrode through a via penetrating through the second planarization film layer.

In some implementations, the S3 includes: forming the first groove in the second planarization film layer.

In some implementations, the S4 includes:
forming the connecting pads and the transfer electrode in a same layer by a same material.

In some implementations, the S8 includes:
forming the first electrode of the organic light emitting device on a side of the planarization layer away from the base substrate.

As shown in FIG. 7, the method further includes:
S10, forming a pixel defining layer on a side of the first electrode of the organic light emitting device away from the base substrate; and
S11, forming a support part on a side of the pixel definition layer away from the base substrate.

In some implementations, the S6 includes:
forming an interlayer insulating layer,
where the interlayer insulating layer is provided therein with a second groove located in the bonding region, an organic insulating layer is filled in the second groove, and the passivation layer is located on a side of the organic insulating layer away from the base substrate.

It should be understood that the order of steps shown in FIG. 7 is exemplary, the actual order of the steps can be adjusted according to process requirements, for example, some of the steps may be performed simultaneously. Moreover, it is not necessary to execute all of the steps shown in FIG. 7, and some of the steps may be omitted as required.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and these modifications and improvements are considered to fall within the scope of the present disclosure.

What is claimed is:

1. A display substrate, comprising:
a base substrate comprising a display region and a bonding region located on a side of the display region, with the display region comprising a main display region and a stress relief region, and the stress relief region comprising a plurality of via regions, and a bridge region among the via regions;
a planarization layer disposed on the base substrate and located in the display region and the bridge region;
an isolation structure and connection pads disposed on the base substrate, with the isolation structure located in the bridge region and surrounding the via regions, and the connection pads located in the bonding region; and
first protective parts which are disposed on a side of the connection pads away from the base substrate and cover the connection pads,
wherein the isolation structure comprises a first groove formed in the planarization layer, and a first isolation sub-layer and a second isolation sub-layer disposed on a side of the planarization layer away from the base substrate, a first space is provided between the first isolation sub-layer and the second isolation sub-layer, and an orthographic projection of the first space on the base substrate is located within an orthographic projection of the first groove on the base substrate, and
the first protective parts, the first isolation sub-layer and the second isolation sub-layer are disposed in a same layer and are made of a same material.

2. The display substrate of claim 1, further comprising:
a driving circuit layer which is disposed on a side of the planarization layer close to the base substrate and comprises a thin film transistor located in the display region;
a passivation layer which is disposed on a side the driving circuit layer away from the base substrate and is located in the main display region; and
an organic light emitting device which is disposed on a side of the planarization layer away from the base substrate and is located in the display region,
wherein a first electrode of the organic light emitting device is connected to a drain of the thin film transistor through a via penetrating through the passivation layer and the planarization layer.

3. The display substrate of claim 2, further comprising:
second protective parts disposed on a side of the connection pads close to the base substrate, with an orthographic projection of each of the connection pads on the base substrate located within an orthographic projection of each of the second protective parts on the base substrate.

4. The display substrate of claim 3, wherein the second protective parts and the passivation layer are disposed in a same layer and are made of a same material.

5. The display substrate of claim 2, wherein the planarization layer comprises a first planarization film layer and a second planarization film layer sequentially disposed on the base substrate, and a transfer electrode is disposed between the first planarization film layer and the second planarization film layer, and
the drain of the thin film transistor is connected to the transfer electrode through a via penetrating through the passivation layer and the first planarization film layer, and the first electrode of the organic light emitting device is connected to the transfer electrode through a via penetrating through the second planarization film layer.

6. The display substrate of claim 5, wherein the first groove is disposed in the second planarization film layer.

7. The display substrate of claim 5, wherein the connection pads and the transfer electrode are disposed in a same layer and are made of a same material.

8. The display substrate of claims 2, wherein the first electrode of the organic light emitting device is disposed on a side of the planarization layer away from the base substrate, a pixel defining layer is disposed on a side of the first electrode of the organic light emitting device away from the base substrate, and a support part is disposed on a side of the pixel defining layer away from the base substrate.

9. The display substrate of claims 2, wherein the driving circuit layer further comprises an interlayer insulating layer provided therein with a second groove located in the bonding region, an organic insulating layer is filled in the second groove, and the passivation layer is located on a side of the organic insulating layer away from the base substrate.

10. The display substrate of claim 1, wherein a shape of a via in the via region comprises a shape of a Chinese character "工".

11. A display device, comprising the display substrate of claims 1.

12. A method for manufacturing a display substrate, comprising:
    forming a base substrate comprising a display region and a bonding region located on a side of the display region, with the display region comprising a main display region and a stress relief region, and the stress relief region comprising a plurality of via regions, and a bridge region among the via regions;
    forming a planarization layer in the display region and the bridge region on the base substrate;
    forming an isolation structure surrounding the via regions in the bridge region on the base substrate;
    forming connection pads in the bonding region on the base substrate; and
    forming first protective parts covering the connection pads on a side of the connection pads away from the base substrate, wherein the isolation structure comprises a first groove formed in the planarization layer, and a first isolation sub-layer and a second isolation sub-layer disposed on a side of the planarization layer away from the base substrate, a first space is provided between the first isolation sub-layer and the second isolation sub-layer, and an orthographic projection of the first space on the base substrate is located within an orthographic projection of the first groove on the base substrate, and
    the first protective parts, the first isolation sub-layer and the second isolation sub-layer are disposed in a same layer and are made of a same material.

13. The method of claim 12, further comprising:
    before forming the planarization layer, forming a driving circuit layer comprising a thin film transistor in the display region on the base substrate;
    forming a passivation layer on a side of the driving circuit layer away from the base substrate, with the passivation layer located in the main display region; and
    forming an organic light emitting device on a side of the planarization layer away from the base substrate, with the organic light emitting device located in the display region,
    wherein a first electrode of the organic light emitting device is connected to a drain of the thin film transistor through a via penetrating through the passivation layer and the planarization layer.

14. The method of claim 13, further comprising:
    forming second protective parts on a side of the connection pads close to the base substrate, wherein an orthographic projection of each of the connection pads on the base substrate is located within an orthographic projection of each of the second protective parts on the base substrate.

15. The method of claim 14, wherein the forming the second protective parts comprises:
    forming the second protective parts and the passivation layer in a same layer by a same material.

16. The method of claim 13, wherein the forming the planarization layer comprises:
    sequentially forming a first planarization film layer, a transfer electrode and a second planarization film layer in a direction away from the base substrate,
    wherein the drain of the thin film transistor is connected to the transfer electrode through a via penetrating through the passivation layer and the first planarization film layer, and the first electrode of the organic light emitting device is connected to the transfer electrode through a via penetrating through the second planarization film layer.

17. The method of claim 16, wherein the forming the isolation structure comprises:
    forming the first groove in the second planarization film layer.

18. The method of claim 16, wherein the forming the connection pads comprises:
    forming the connecting pads and the transfer electrode in a same layer by a same material.

19. The method of claims 13, wherein the forming the organic light emitting device comprises:
    forming the first electrode of the organic light emitting device on a side of the planarization layer away from the base substrate;
    the method further comprises:
    forming a pixel defining layer on a side of the first electrode of the organic light emitting device away from the base substrate; and
    forming a support part on a side of the pixel definition layer away from the base substrate.

20. The method of claims 13, wherein the forming the driving circuit layer comprises:
    forming an interlayer insulating layer,
    wherein the interlayer insulating layer is provided therein with a second groove located in the bonding region, an organic insulating layer is filled in the second groove, and the passivation layer is located on a side of the organic insulating layer away from the base substrate.

* * * * *